United States Patent
van Beek et al.

(10) Patent No.: US 9,535,137 B2
(45) Date of Patent: Jan. 3, 2017

(54) MEMBRANE BASED MAGNETOMETER

(71) Applicant: ams International AG, Rapperswil-Jona (CH)

(72) Inventors: Jozef van Beek, Rosemalen (NL); Casper van der Avoort, Eindhoven (NL)

(73) Assignee: AMS INTERNATIONAL AG, Rapperswil-Jona (CH)

( * ) Notice: Subject to any disclaimer, the term of this patent is extended or adjusted under 35 U.S.C. 154(b) by 210 days.

(21) Appl. No.: 14/466,488

(22) Filed: Aug. 22, 2014

(65) Prior Publication Data
US 2016/0054400 A1    Feb. 25, 2016

(51) Int. Cl.
G01R 33/028 (2006.01)
G01C 17/28 (2006.01)
G01R 33/038 (2006.01)

(52) U.S. Cl.
CPC .......... G01R 33/0286 (2013.01); G01C 17/28 (2013.01); G01R 33/0283 (2013.01); G01R 33/038 (2013.01)

(58) Field of Classification Search
CPC ....... G01C 17/28; G01R 33/02; G01R 33/028; G01R 33/0283; G01R 33/0286
See application file for complete search history.

(56) References Cited

U.S. PATENT DOCUMENTS

| | | | |
|---|---|---|---|
| 8,407,905 B1 | 4/2013 | Hsu et al. | |
| 2003/0020472 A1 | 1/2003 | Kretschmann et al. | |
| 2005/0030115 A1 | 2/2005 | Richards et al. | |
| 2007/0030001 A1 | 2/2007 | Brunson et al. | |
| 2007/0096729 A1 | 5/2007 | Brunson et al. | |
| 2008/0070338 A1 | 3/2008 | Zribi et al. | |
| 2010/0165518 A1* | 7/2010 | Boone, Jr. ............ | G01R 33/028 360/324 |

(Continued)

FOREIGN PATENT DOCUMENTS

DE    102009046515 A1    5/2011

OTHER PUBLICATIONS

Nigel Robson, Baolab Microsystems, S.L., CMOS 3D Compass, BLBC3-D Monolithic CMOS 3D Electronic Compass for Mobile Applications, Feb. 5, 2014, 1-3.

(Continued)

*Primary Examiner* — Minh N Tang
*Assistant Examiner* — David Frederiksen
(74) *Attorney, Agent, or Firm* — McDermott Will & Emery LLP

(57) ABSTRACT

Various exemplary embodiments relate to a magnetometer device to measure oscillation frequency, including a feedthrough loop including an amplifier and a voltage bias connected to a first input of a metallic membrane; a membrane ground connected to a membrane output; a fixed plate including a first fixed plate output connected to a second input of the amplifier, wherein the fixed plate is physically separated from the metallic membrane but connected to the metallic membrane by a Lorentz force, and where the physical separation differs due to an angle of a magnetic field relative to a direction of a current; a second fixed plate output sensitive to the Lorentz force; and a circuit connected to the second fixed plate output to calculate an angle of the magnetic force based upon the Lorentz force.

21 Claims, 5 Drawing Sheets

(56) References Cited

U.S. PATENT DOCUMENTS

| | | | |
|---|---|---|---|
| 2010/0295138 A1 | 11/2010 | Montanya Silvestre et al. | |
| 2011/0050214 A1 | 3/2011 | Bahreyni et al. | |
| 2012/0006085 A1* | 1/2012 | Johnson | B21D 26/14 72/54 |
| 2013/0002244 A1* | 1/2013 | Quevy | G01R 33/0286 324/244 |
| 2014/0049256 A1 | 2/2014 | Smith et al. | |
| 2014/0125325 A1* | 5/2014 | Ocak | G01R 33/0286 324/207.13 |
| 2014/0292323 A1* | 10/2014 | Farghaly | G01R 33/0286 324/259 |
| 2015/0035526 A1* | 2/2015 | Langfelder | G01R 33/028 324/247 |

OTHER PUBLICATIONS

David A. Horsley et al, "MEMS Lorentz Force Magnetic Sensor Based on a Balanced Torsional Resonator", M3P.013; Transducers 2013; Barcelona, Spain, Jun. 2013, 66-69.

N. Dumas, et al., "Design of a Micromachined Cmos Compass", 2B3.4, Jun. 5, 2005, 405-408.

* cited by examiner

MEMBRANE BASED MAGNETOMETER

TECHNICAL FIELD

Various exemplary embodiments disclosed herein relate generally to an electronic device or device component including a metallic membrane that measures and reports on the device's orientation with relation to a magnetic field.

A multiple degree-of-freedom inertial measurement unit, or IMU, is an electronic device or device component that measures and reports on the device's velocity, orientation, and gravitational forces, and may be a component of mobile hand held devices for purposes of navigation and orientation. One embodiment of IMU comprises a multi-package or multi-chip combination of an accelerometer, gyroscope, altimeter, and a compass or magnetometer, often integrated in Microelectromechanical systems (MEMS).

Although miniaturization, integration, standardization and cost reduction of IMUs has led to their widespread use as compasses and magnetometers in mobile applications such as smartphones and specific-purpose navigation and location-based devices, the IMUs on the market nevertheless require specialized manufacturing and, in some cases, expensive materials, needlessly adding to the Bill of Materials (BOM) cost of these devices.

SUMMARY

In light of the present desire for a small, cost effective, sensitive compass, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a magnetometer device to measure oscillation frequency, including a feedthrough loop including an amplifier and a voltage bias connected to a first input of a metallic membrane; a membrane ground connected to a membrane output; a fixed plate including a first fixed plate output connected to a second input of the amplifier, wherein the fixed plate is physically separated from the metallic membrane but connected to the metallic membrane by a Lorentz force, and where the physical separation differs due to an angle of a magnetic field relative to a direction of a current; a second fixed plate output sensitive to the Lorentz force; and a circuit connected to the second fixed plate output to calculate an angle of the magnetic force based upon the Lorentz force. In alternative embodiments the metallic membrane includes a continuous sheet of metal. In some embodiments, the metallic membrane further includes a continuous metallic winding running in parallel lines from the membrane input to the membrane output. In some further exemplary embodiments, the metallic membrane further includes a dielectric sheet in which the metallic winding is embedded.

In some embodiments, the metallic membrane has an equivalent electrical inductance proportional to the mechanical mass of the metallic membrane, an equivalent electrical capacitance proportional to the mechanical stiffness of the metallic membrane, and an equivalent electrical resistance proportional to the mechanical damping of the metallic membrane. In some embodiments, the amplifier includes a current controlled voltage source. In some alternative embodiments, the current controlled voltage source includes a gain. In some embodiments, the fixed plate has the same proportions as the metallic membrane. In alternative embodiments, the metallic membrane is freestanding. In some embodiments, the fixed plate is fixed to a substrate. In some other alternative embodiments, the fixed plate is fixed to a wafer.

Various exemplary embodiments relate to a method of measuring the orientation of a device, including driving an alternating electrical current through a metallic membrane; measuring a shift of an oscillation frequency in the metallic membrane; and calculating an angle of an external magnetic field relative to the metallic membrane, based upon the shift of the oscillation frequency and the current direction. Alternative embodiments further include creating a feedback loop to drive the metallic membrane into an oscillation. In some embodiments, the oscillation is close to a mechanical resonance frequency of the metallic membrane.

In some alternative embodiments, the step of creating a feedback loop includes creating a capacitive displacement current; feeding the capacitive displacement current to an amplifier; amplifying, by the amplifier, the capacitive displacement current; and feeding the amplified current as voltage to the metallic membrane. In some alternative embodiments, the method further includes generating a bias voltage between the metallic membrane and a fixed ground plate. In some embodiments, the fixed ground plate is situated a small distance from the metallic membrane. In alternative embodiments, the fixed ground plate has the same proportions as the metallic membrane.

In some embodiments, the step of calculating the angle of a magnetic force further includes cancelling effects that might cause a detuning of the oscillation frequency. In alternative embodiments, the step of cancelling effects includes subtracting the oscillation frequency for one or more current directions. Alternative embodiments of the method further include filtering interference from the oscillation of the metallic membrane. In some embodiments, the step of filtering interference includes measuring the frequency of the oscillator over a sufficient time period.

Various exemplary embodiments relate to a magnetometer device to measure the orientation of a device, the magnetometer device including an oscillator including a metallic membrane and a feedback loop; the feedback loop configured to drive an alternating electrical current through the metallic membrane, and to drive the metallic membrane into an oscillation; and a processor configured to measure a shift of oscillation frequency caused by the feedback loop and metallic membrane, and calculate an angle of an external magnetic field relative to a direction of the current, based upon the shift of oscillation frequency and the current direction. In some alternative embodiments, the oscillation is close to a mechanical resonance frequency of the metallic membrane. In alternative embodiments, the feedback loop further includes an amplifier and is further configured to create a capacitive displacement current; feed the capacitive displacement current to the amplifier; amplify, by the amplifier, the capacitive displacement current; and feed the amplified current as voltage to the metallic membrane.

In some alternative embodiments, the magnetometer device further includes a fixed ground plate, the device further configured to generate a bias voltage between the metallic membrane and the fixed ground plate. In other embodiments, the fixed ground plate is situated a small distance from the metallic membrane. In some embodiments, the fixed ground plate has the same proportions as the metallic membrane. In alternative embodiments, in calculating the angle of an external magnetic force, the processor is further configured to cancel oscillation frequency detuning effects. In some alternative embodiments, the processor is further configured to, when cancelling oscillation frequency detuning effects, subtract the oscillation frequency for one or more current directions.

In alternative embodiments of the magnetometer device, the processor is further configured to filter interference from the oscillation of the metallic membrane. In other embodiments, the processor is further configured to measure the frequency of the oscillator over a sufficient time period.

It should be apparent that, in this manner, various exemplary embodiments enable a small, cost effective device that is sensitive to the angle of a magnetic field. In particular, by measuring the displacement of a metallic membrane subject to a force generated by the effects of the magnetic field.

BRIEF DESCRIPTION OF THE DRAWINGS

In order to better understand various exemplary embodiments, reference is made to the accompanying drawings, wherein.

DETAILED DESCRIPTION

Figure 1:
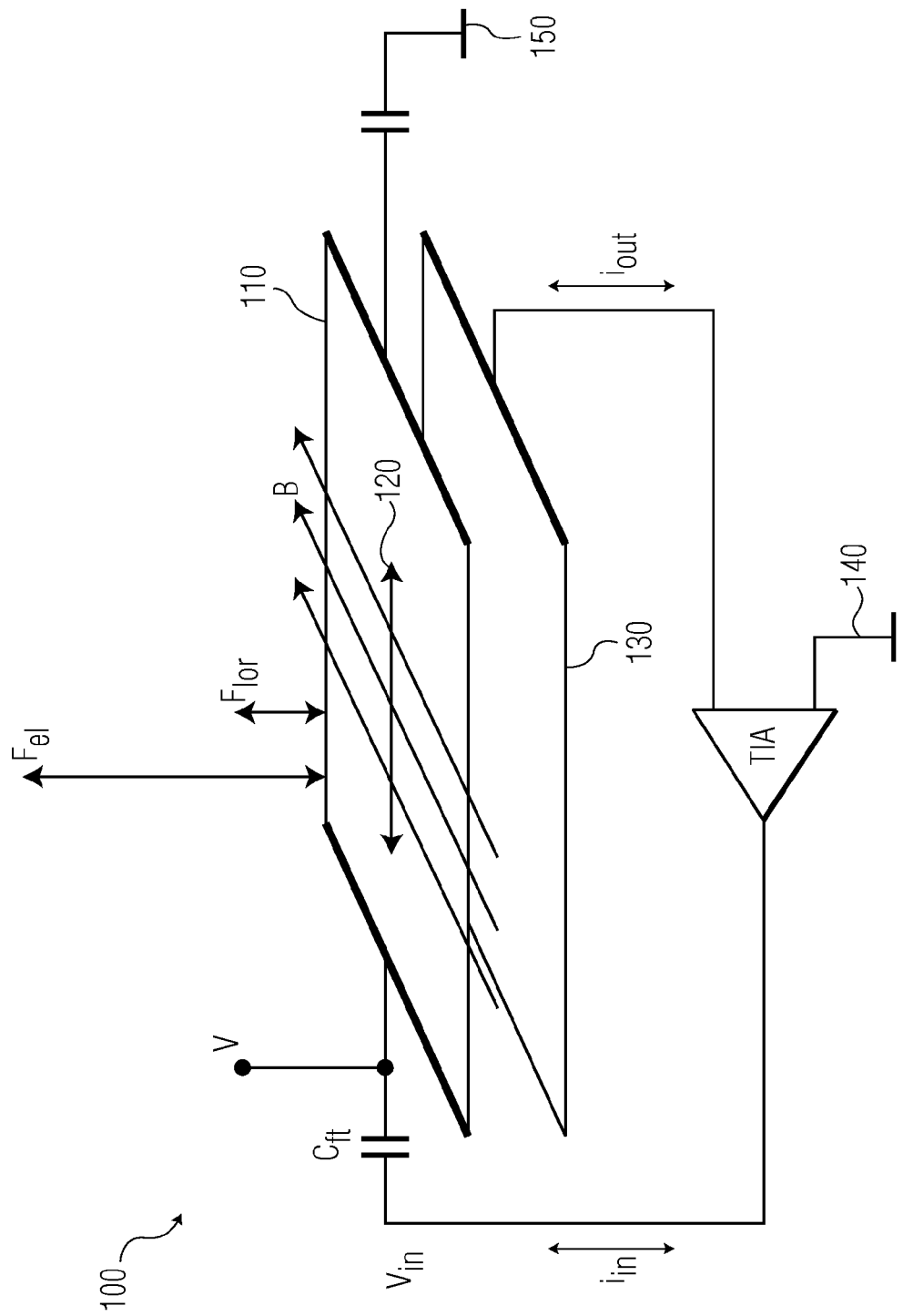
FIG. 1 illustrates the behavior of an exemplary freestanding metallic membrane when excited into mechanical resonance.

In view of the foregoing, it would be desirable to measure the orientation of a device relative to a magnetic field using materials that are less expensive, fit into a smaller form factor, and may be used to implement multiple sensors that measure various conditions.

Lorentz-force-based MEMS sensors known in the art, such as Hall-effect sensors or anisotropic magnetoresistance (AMR) sensors, electronically sense the mechanical motion of the MEMS structure due to the Lorentz force acting on a current-carrying conductor in the magnetic field. (Note that the conductors in known Lorentz-force sensors are constructed out of semiconductor materials). In other words, these sensors measure mechanical displacement. In various applications, the mechanical structure is often driven to its resonance in order to obtain the maximum output signal. Piezoresistive and electrostatic transduction may be used to electronically detect the orientation of a magnetic field. The piezoresistive effect is a change in the electrical resistivity of a semiconductor or metal when mechanical strain is applied.

Given the desire for a lower-cost, easily-manufactured magnetometer, a system and method are described for measuring the in-plane orientation of the earth's magnetic field using standard, non-magnetic, complementary metal-oxide-semiconductor (CMOS) compatible materials. For example, the system described herein may be based on mechanical oscillation frequency shift measurements of an oscillating metallic membrane. This is distinct from presently known magnetometer applications using Hall-effect or AMR sensors, which are, due to their required mechanical properties (including, for example, measurement of physical displacement and manufacture from semiconductors) assembled separately from other sensors. Further, because a magnetometer including a freestanding membrane may be manufactured using the same materials as currently-existing MEMS sensors (such as pressure sensors) installed on top of CMOS, the magnetic sensors may be combined on a single CMOS chip forming part of an inertial measurement unit without adding any process complexity or associated cost. This would be useful for a variety of applications such as one component in a package of sensors having multiple functionality (for example, to sense air pressure (e.g. in an altimeter) and physical orientation, which may be combined to achieve 3D location determination), as may be included in a mobile device or other handheld device, navigational equipment, or in a vehicle.

A freestanding metallic membrane may be excited into mechanical oscillation using a combination of a Lorentz and electrostatic force. Frequency can be measured to a high degree of accuracy. The Lorentz force is dependent on the angle between the in-plane magnetic field and the electric current that is sent through the metallic membrane. A change in angle will cause a change in Lorentz force, and hence a slight but detectable detuning of the oscillation frequency. Measuring the shift in oscillation frequency enables a determination of the orientation of the earth's magnetic field with respect to the magnetometer.

Where the metallic membrane has the same dimensions and physical properties as a membrane used for sensing other physical ambient conditions such as ambient pressure, the same membrane may be used to sense both conditions. For example, time-multiplexing may be employed to use the same physical sensor as an altimeter and as a magnetometer. Besides saving manufacturing and materials costs, and simplifying the manufacturing process, a smaller form-factor may be achieved by combining functionality on a single structure.

Additionally, inductors and other magnetic field generating elements may easily be integrated on the underlying CMOS, allowing in-situ calibration and trimming of the magnetometer using electrical stimuli. Because the required components may be integrated, calibration procedures may be repeated in the field, thereby compensating for any sensor drift caused by ageing or other factors. Further, any magnetometer cross-sensitivity to forces other than a magnetic field, such as ambient pressure or temperature, may be more accurately known and suppressed during calibration due the fact that the pressure and temperature measurements may be made in close proximity to the magnetometer.

Referring now to the drawings, in which like numerals refer to like components or steps, there are disclosed broad aspects of various exemplary embodiments.

FIG. 1 illustrates the behavior of an exemplary freestanding metallic membrane 110 when excited into mechanical resonance by a combination of a Lorentz force $F_{lor}$ and electrostatic force $F_{el}$. A membrane-based magnetometer 100 may include a membrane 110 in an oscillator loop (including $i_{in}$, $C_{f}$, V, membrane 110, ground 150, $i_{out}$, trans-impedance amplifier TIA, and ground 140). The Lorentz force $F_{lor}$ may be generated by driving an electrical current such as an AC current $i_{in}$, 120 through membrane 110, combined with the earth's magnetic field B. Because the Lorentz force runs linear with current density, a metallic membrane 110 with a low resistance and larger current density may be used so that they may generate a larger Lorentz force (e.g., in comparison with semiconductors which have higher resistance).

There are several advantages of an exemplary metallic membrane such as membrane 110 over semiconductor-based Lorentz-force sensors known in the art. In simplest terms (more detailed calculations are discussed later), the Lorentz force $F_{lor}$ is a product of the length l of the membrane 110 times the current $i_{in}$ times the magnetic field B times the sine of the angle between the direction of the magnetic field and the direction of the current ($F_{lor}=l*i_{in}*B*\sin \alpha$), but because the membrane is a mechanical system, random mechanical noise will also affect the movement of membrane 110. This random noise may be expressed as a force $F_{noise}=\sqrt{4k_bT\gamma\Delta f}$, where $k_b$ is the Boltzmann constant, T is the absolute temperature ambient to the membrane 110, γ is the damping coefficient of the membrane 110 (as it interacts with the air around it), multiplied by the bandwidth Δf over which the measurement is taken (as with any white noise phenomena, bandwidth is a factor), and it may be accounted for in sensor calculations. The greater the signal-to-noise ratio, the more sensitive the magnetometer will be. The signal-to-noise ratio may be maximized by producing a large Lorentz force $F_{lor}$ relative to the mechanical noise of the system $F_{noise}$, which should be as small as possible. $F_{noise}$ can be minimized by minimizing the damping coefficient γ, which can be accomplished by maximizing the quality factor Q of the membrane 110. The power P required to generate the Lorentz force $F_{lor}$ is a function of the current $i_{in}$ sent over the membrane 110, and the electrical resistance R of the membrane ($P=i_{in}^2*R$)—because the resistance of metal is lower than the resistance of a semiconductor, less power will be required to generate a large Lorentz force $F_{lor}$ in a metallic membrane 110. Additionally, increasing the length l will increase the Lorentz force $F_{lor}$. Increasing the length l without increasing the dimensions of the membrane 110 may be accomplished with the exemplary alternative embodiment shown in FIG. 2A.

Figure 2A:
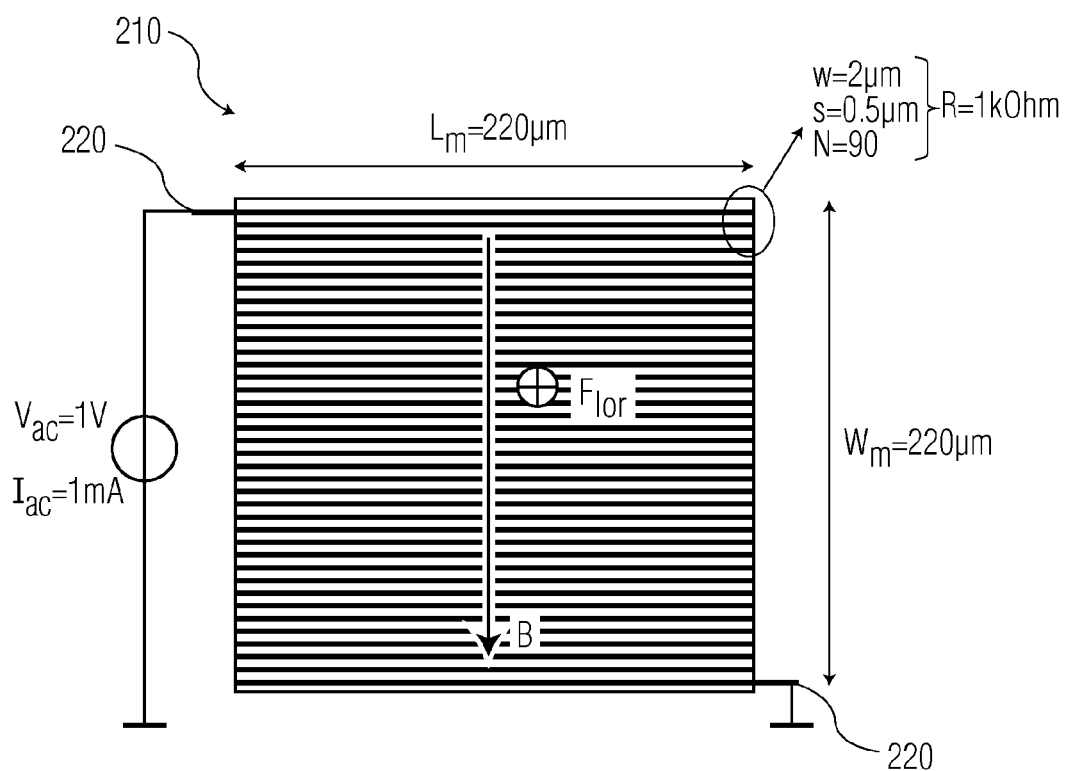
FIG. 2A illustrates an exemplary alternative embodiment of the membrane in FIG. 1.
Figure 2B:
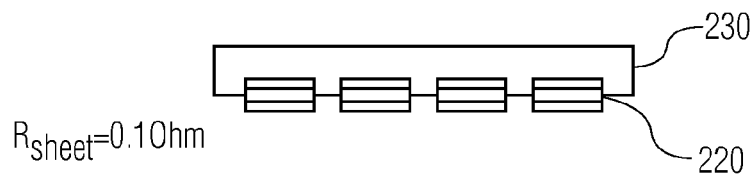
FIG. 2B illustrates a cross-section of the membrane of FIG. 1.

FIG. 2A shows an exemplary alternative embodiment 210 of membrane 110. In some embodiments, metallic membrane 210 may include metallic tracers 220, which may be embedded in the membrane 110 as illustrated in FIG. 2B, as an alternative to membrane 110 consisting of a continuous sheet of metal. The tracers 220 may be embedded as metallic lines/windings running from the side of input $v_{in}$ to output ground 150 in series (in one continuous run around the membrane to form a coil), and together form the membrane 210.

It is important with a long wire to keep electrical resistance low, because, as noted above, with a larger current there will be a larger Lorentz force, and little power dissipation—metallic windings may be used to lengthen l while keeping R low. Most Lorentz-force-based sensors use doped silicon, which has a specific resistance of about 1 mOhm*cm, which is 1000 times that of metal windings at about 1 μOhm*cm (micro Ohm centimeter); thus metal membranes are more efficient in terms if signal-to-noise ratio and power dissipation. Additionally, using multiple tracer windings rather than a single sheet will maximize wire length and result in a higher combined total resistance of the tracer lines, and a better impedance match with the supply voltage, which, because membrane 210 is connected to a CMOS, may be 1-3 volts; it is easier to achieve dissipation of an exemplary input current of 1 milliwatt from a supply voltage of ~1 volt over multiple tracer lines with higher resistance (e.g. >1 kilo ohm) than over a sheet with lower resistance (e.g. 0.1Ω). Alternatively, v-converters may be used to lower the current over the membrane sheet, but this arrangement would add complexity and costs which may be avoided.

In exemplary membrane 210, trace width $w_t$ may be 2 μm, spacing between adjacent tracers may be 0.5 μm, number of traces N may be 90, and membrane width w and length l may be 220 μm. Lorentz force $F_{lor}$ is shown running normal to the tracer windings 220 where magnetic force B runs perpendicular to the windings 220. Metallic windings 220 may be embedded in a dielectric sheet 230 to form membrane 210. Because the number of tracers N is 90, the effective length $l_{wire}$ used to produce the Lorentz force $F_{lor}$ is multiplied N times the width of the membrane, or 90*220 μm, the calculation of the Lorentz force, in the simple membrane of FIG. 1 expressed as $F_{lor}=l*i_{in}*B*\sin \alpha$ becomes multiplied N times so that $F_{lor}=N*l*i_{in}*B*\sin \alpha$—thus, the Lorentz force in a membrane using metallic windings will be much higher than a single metallic membrane, where l is limited by the length of the membrane sheet.

An exemplary metallic membrane with measurements similar to those shown in FIGS. 1, 2A, and 2B, with lines of 2 μm spaced at 0.5 μm may be expected to have a resonance frequency of 878.956 kHz, quality factor Q of 223.8, mass m of $6.26^{-10}$ kg, spring constant k of $1.91^4$ N/m, and damping coefficient γ (calculated from Q, m, and k, since Q=sqrt(k*m)/γ) of $1.53^{-5}$ Ns/m. Note that a continuous metallic membrane and a membrane with etched trenches covered by a dielectric to form tracer windings may be expected to have relatively similar mechanical properties. As noted above, the sheet resistance may be 0.1Ω, and the total resistance of the wires is 1 kOhm.

As shown in FIG. 1, Lorentz force $F_{lor}$ is directed normal or perpendicular to membrane 110 when current $i_{in}$ has a component 120 that is perpendicular to the magnetic field B and both current $i_{in}$ and magnetic field B are directed in the plane of the membrane 110. The electrostatic force $F_{el}$ may be generated by an AC voltage $v_{in}$ in addition to a DC bias voltage V between the metallic membrane 110 and a fixed ground plate 130 situated a small distance from the metallic membrane 110. (Note that in the absence of any current, ground plate 130 and membrane 110 will still be situated a small distance apart). Because metallic membrane 110 has a finite electrical resistance, the voltage drop that results when AC current $i_{in}$ is applied to membrane 110 causes AC voltage $v_{in}$. Note that in exemplary compass 100, because membrane 110 is grounded 150 to one side, the voltage drop across the membrane 110 will be equal to $v_{in}$.

Further, as AC current $i_{in}$ is driven 120 through freely-moving membrane 110, which may include a metal plate that will move relative to fixed ground plate 130 (which may be fixed to a substrate or wafer), causing a capacitive displacement current $i_{out}$ that may be fed to a trans-impedance amplifier TIA to amply the signal and feed it back as voltage $v_{in}$ to the freestanding metallic membrane, such that a feedback loop may be created to drive the freestanding membrane into oscillation with a frequency that is close to its mechanical resonance frequency. If current $i_{in}$ is an AC current with a frequency matched to the resonance frequency of membrane 110, in a DC magnetic field, an AC Lorentz force $F_{lor}$ is generated at the mechanical resonance of the membrane 110. A frequency shift will be caused by the interaction of the Lorentz force $F_{lor}$ and the electrostatic force $F_{el}$; the electrostatic force is in turn generated by the electrostatic force between membrane 110 and ground plate 130.

The oscillation frequency will be dependent on the loop phase, which is dependent on the magnitude of the Lorentz force, and thus the oscillation frequency will be dependent on the magnetic field that is being measured. Therefore, by measuring the oscillating frequency it is possible to derive the direction of the magnetic field with respect to the AC driving current, and thus determine the direction of the earth's magnetic field.

Figure 3:
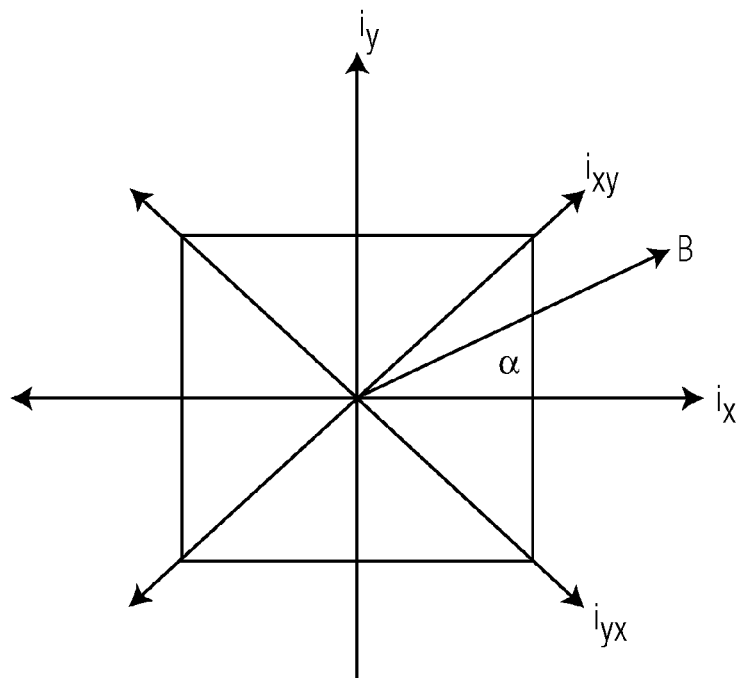
FIG. 3 illustrates the effect on the oscillation frequency of the direction of an exemplary current relative to an exemplary magnetic field.

FIG. 3 illustrates the effect of the direction 120 of an exemplary current $i_{in}$ relative to the earth's magnetic field B, on the oscillation frequency relative to the top view of an exemplary freestanding membrane such as membrane 110 in FIG. 1. As seen in FIG. 3, a full 360° angle discrimination $i_y$, $i_{xy}$, $i_x$, $i_{yx}$, etc. (back around through to $i_y$) may be established when current $i_{in}$ is sent through membrane 110 at different directions. Note that because the earth's magnetic field B will have a relatively fixed magnitude within a given area on the earth's surface, the only variable that will change as the device rotates is the angle $\alpha$. A current $i_{in}$ running in the x-direction 120 will cause a different detuning of the oscillation frequency than a current running in the y-direction, because the magnitude of the Lorentz force will differ between the two. Similarly, the frequency detuning from a current 120 running in the x=y diagonal will differ from a current 120 running in the x=−y diagonal. By determining a reference frequency, comparing these frequencies for different current directions, and measuring the difference of these different detuning frequencies, the angle $\alpha$ may be resolved over 360°, and the magnetic field fully discriminated. Thus, determining a magnetic field based upon a frequency measurement may be expected to achieve a higher resolution and accuracy than determination based upon a mechanical measurement. Additionally, to cancel unwanted effects that might also cause a detuning of the oscillation frequency—such as frequency shifts caused by, for example, ageing materials, temperature, and varying bias voltage—the oscillation frequency may be subtracted for the different current directions.

Any interference caused by electric fields will be added to the input voltage $v_{in}$ or the output current $i_{out}$, and will add noise to the oscillator in the form of noise in the oscillation amplitude or phase. If this noise is random, it may be filtered by measuring the frequency of the oscillator over a sufficient time period, as discussed below. A permanent shift of oscillation frequency or phase is less likely than random interference, but may be filtered through calibration techniques. In some embodiments, a method of filtering out electromagnetic interference (EMI) may be to ground the plate that is facing the outside world. Note that in FIG. 1, ground plate 130 is connected to virtual ground 140, but the arrangement of FIG. 1 may be altered so that the membrane 110 is connected to ground (through the TIA) in order to suppress EMI. Note that the CMOS chip that includes magnetometer 100 may also be separately shielded from EMI using a ground plate or other method.

Note also that if magnetometer 100 is duty-cycled (only turned on at intervals or as required), mechanical inertia of the membrane will require a brief "warm up" delay before a reliable reading may be taken. This delay may be undetectable to a user because in exemplary embodiments it may be 1 millisecond (e.g., quality factor Q*period, where an exemplary Q=100, and frequency=100 kHZ), but some applications may require frequent readings. Thus, if measurement periods are required that span over a longer period of time, e.g. 1 second, then the device may be duty-cycled, but if measurements every millisecond are desired or required, the device may be on for as long as measurements are required (because otherwise the mechanics would be too slow to accommodate the duty cycle and still take accurate required measurements).

In order to calculate the in-plane orientation of the earth's magnetic field, a model may be determined to describe the relationship of the oscillation frequency of a membrane such as exemplary membrane 110 with a reference frequency as a function of the direction of the magnetic field. As noted above, the Lorentz force equals the outer product of the current times the magnetic field.

A time-alternating Lorentz force $F_{lor}$ acting on an exemplary membrane 110 may be written as (equation [1]) $F_{lor}=li_{in}e^{j\omega t} B \sin \alpha$ where l is the length of the membrane, B is the magnitude of the magnetic field, and $\alpha$ the angle between the magnetic field and direction of the current $i_{in}$. Thus, the Lorentz force $F_{lor}$ is proportional to the length l of the membrane 110 through which the current $i_{in}$ is forced, and the angle B sin $\alpha$ between the current $i_{in}$ and the magnetic field B, where current $i_{in}$ is an AC current with frequency j$\omega$t and magnetic field B is a DC field (an AC current times a DC field produces an AC Lorentz force). In embodiments where the membrane 110 includes embedded metallic tracers which together form the membrane 110, instead of a continuous sheet of metal, the equation $li_{in}e^{j\omega t}$ B sin $\alpha$ will be multiplied by an integer N corresponding to the number of metallic lines running through membrane 110. Thus, as discussed above, by using multiple tracers N rather than a continuous sheet of metal, the Lorentz force $F_{lor}$ will be N times bigger and the sensor will be N times more sensitive.

The voltage $v_{in}$ and current $i_{in}$ running through the membrane 110 are related through Ohm's law, $$v_{in} = \frac{Ri_{in}}{2}, \quad \text{(equation [2])}$$

where the factor ½ takes into account that the voltage drops over the entire length of the membrane 110 (due to ground 150 as discussed above), and therefore the average voltage is one-half of the total voltage drop (in other words, the calculation assumes the voltage to be equal to the voltage in the center of the membrane 110).

Thus, the Lorentz force $F_{lor}$ may be expressed in terms of voltage $v_{in}$ as $$F_{lor} = \frac{2lv_{in}}{R}e^{j\omega t}B\sin\alpha, \quad \text{(equation [3])}$$

which is derived from the prior two equations [1], [2]. The electrostatic force $F_{el}$ between the membrane 110 and ground plate 130 is also expressed in terms of voltage—the average AC voltage on the membrane 110 causes an attractive electrostatic force as stated by $$F_{el} = V\frac{\varepsilon_0 A}{g^2}v_{in}e^{j\omega t}, \quad \text{(equation [4])}$$

where V is a static bias voltage, $\epsilon_0$ is the permittivity, A=lw is the area of the membrane 110, and g is the distance of the gap between membrane 110 and ground plate 130.

Output current $i_{out}$ is related to the speed of the membrane 110. This is a standard expression in many MEMs, where if there is a change in capacitance that is under a bias voltage a displacement current $i_{out}$ results. The deflection of the membrane causes a capacitance change, and thus a displacement current that may be expressed as $$i_{out} = V\frac{\epsilon_0 A}{g^2}\dot{x}, \qquad \text{(equation [5])}$$

where $\dot{x}$ is the out-of-plane directed speed of the membrane.

Further, the freestanding membrane 110 may be considered a mass-spring system governed by the equation of motion (mass m times the acceleration $\ddot{x}$ of membrane 110 plus damping $\gamma$ times the speed $\dot{x}$ of membrane 110 plus the spring force k times the displacement x of membrane 110), (equation [6]) $m\ddot{x}+\gamma\dot{x}+kx=F_{lor}+F_{el}$, and are in balance with the force that is applied to the membrane, the Lorentz force $F_{lor}$ and electrostatic force $F_{el}$, which may be rewritten in electrical terms as the impedance (the relationship between the input voltage $v_{in}$ and the output current $i_{out}$) by combining [3], [4], [5], and [6], such that:—

$$L_B\frac{\partial i_{out}}{\partial t} + R_B i_{out} + \frac{1}{C_B}\int i_{out}dt = v_{in}, \qquad \text{(equation [7])}$$

(in other words, input voltage $v_{in}$ is equivalent to the impedance caused by inductance, the impedance caused by resistance, and the impedance caused by the capacitance).

$L_B$, $C_B$, and $R_B$ (mechanical mass, stiffness, and damping) may be expressed as $$L_B = \frac{m}{\eta^2}(1-\delta) \qquad \text{(equation [8])}$$

(the inductance is proportional to the mass m), $$R_B = \frac{\gamma}{\eta^2}(1-\delta) \qquad \text{(equation [9])}$$

(the resistance is proportional to damping $\gamma$), and $$C_B = \frac{\eta^2}{k}(1+\delta) \qquad \text{(equation [10])}$$

(the capacitance is inversely proportional to the spring force k), where the electrostatic coupling factor $\eta$ and magnetic detuning factor $\delta$ may be expressed as $$\eta = V\frac{\epsilon_0 lw}{g^2} \text{ and} \qquad \text{(equation [11])}$$

$$\delta = \frac{B}{V}\frac{2}{\epsilon_0 R_{sheet}}\frac{g^2}{l}\sin\alpha. \qquad \text{(equation [12])}$$

As may be seen, $\delta$ is a function of magnetic fields—if the magnetic field B=0, $\delta$=0, and $L_B$, $C_B$, and $R_B$ are fixed values—if magnetic field B≠0, and sin α≠0 (because if the current $i_{in}$ and the magnetic force B are running in parallel there will also be no Lorentz force $F_{lor}$), then $L_B$, $C_B$, and $R_B$ will change values as a function of the magnetic fields. Thus, if membrane 200 is to be used as a compass, the equation $$\delta = \frac{B}{V}\frac{2}{\epsilon_0 R_{sheet}}\frac{g^2}{l}\sin\alpha \qquad \text{(equation [13])}$$

will be relevant because it may be based on the earth's magnetic field B, and the variable α, which as noted above changes as the device rotates, and thus by measuring changes in the value of shifts in oscillation frequency $\delta$, changes in the value α may be used to determine direction. Measurements of other magnetic fields B are also possible.

Figure 4:
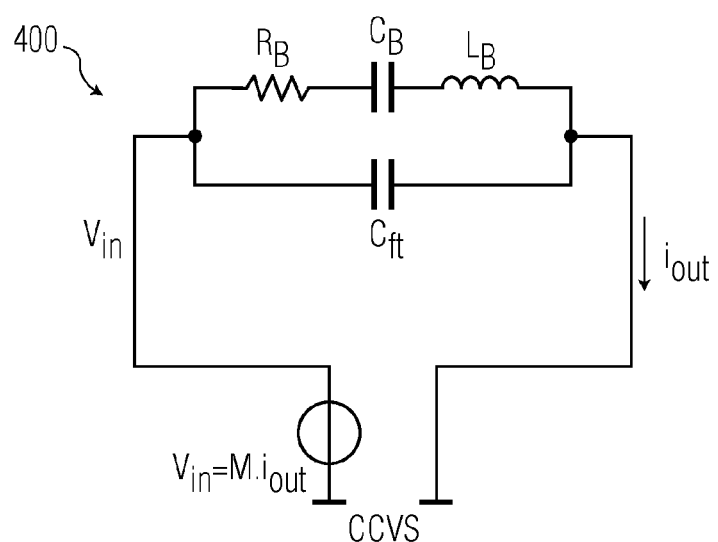
FIG. 4 illustrates an exemplary circuit electrically equivalent to the oscillator illustrated by FIG. 1.

FIG. 4 illustrates an exemplary circuit 400 that is an electrical equivalent of the complete electrical circuit of an oscillator similar to the oscillator loop shown in FIG. 1. As shown in [7] above, the resonance of a mechanical resonator (such as resonating membrane 110) may be described in terms of an equivalent inductance, capacitance, and resistance, which in FIG. 4 are represented by electrical elements resistor $R_B$, capacitor $C_B$, and inductor $L_B$, where $R_B$ is proportional to mechanical damping of membrane 110, $C_B$ is proportional to the mechanical stiffness of membrane 110, and $L_B$ is proportional to the mechanical mass of the system. The series RLC connection may be described by the equation of motion described above and is in parallel with the feed-through capacitance $C_{ft}$ formed by the membrane in combination with the plane underneath the membrane 110 (e.g. ground plate 130). The transimpedance amplifier TIA may be considered a current controlled voltage source (CCVS) with a gain M. Thus, the TIA/CCVS translates incoming current into voltage $v_{in}$, which travels over the resonant circuit $R_B$, $C_B$, and $L_B$, and a parasitic feedthrough $C_{ft}$ in parallel—the capacitor $C_{ft}$ is required because, apart from the mechanical resonance, there will be some capacitive crosstalk between membrane 110 and ground plate 130. The phase shift of CCVS is assumed to be constant, and the phase shift over the $C_{ft}//R_B-C_B-L_B$ branches may also be constant in order to meet the oscillation condition (according to the Barkhausen stability criterion). Because the phase shift is a constant, it follows there is a relation between the values of $R_B-C_B-L_B$ and the oscillation frequency. Thus, when a magnetic field is applied to circuit 400 (which represents membrane-based compass 100), the field will change equivalent resistance $R_B$ such that the oscillation frequency will change proportionally because the phase shift in oscillator loop 400 is shifting. For example, if $R_B$, $C_B$, and $L_B$ are changed by a fraction Δ, the oscillation frequency of exemplary circuit 400 is changed (because of the relationship between the magnetic field and the oscillation frequency), causing an interplay of feedthrough capacity $C_{ft}$ with $R_B$, $C_B$, and $L_B$. The oscillation frequency may be measured as an output in order to determine the magnetic field using the calculations described herein.

Figure 5:
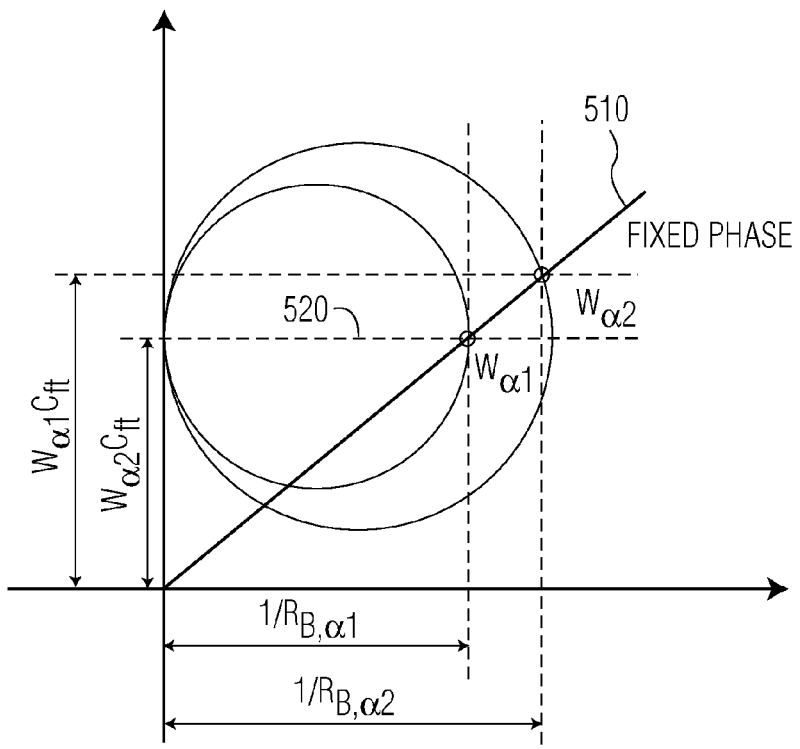
FIG. 5 illustrates a plot of the admittance of a resonator membrane in the imaginary plane.

FIG. 5 illustrates a plot of the admittance (which is 1/impedance) of the resonator 110 in the imaginary plane. The admittance of the resonator is described by $$Y = j\omega C_{ft} + \frac{1}{j\omega L_B + R_B + \frac{1}{j\omega C_B}}. \qquad \text{(equation [14])}$$

If $\omega_0$ is defined as $$\omega_0 = \frac{1}{\sqrt{L_B C_B}}, \quad \text{(equation [15])}$$

Q is defined as $$Q = \frac{1}{R_B}\sqrt{\frac{L_B}{C_B}}, \quad \text{(equation [16])}$$

and $\omega$ is defined as (equation [17]) $\omega=\omega_0+\Delta\omega$, and assuming that $\Delta\omega<<\omega_0$, the admittance ([14]) may be rewritten as $$Y = j(\omega_0 + \Delta\omega)C_{ft} + \frac{1}{R_B}\left(1 - 2jQ\frac{\Delta\omega}{\omega_0}\right). \quad \text{(equation [18])}$$

The phase of the admittance may be a constant such that the ratio of real and imaginary terms is a constant, $$(\omega_0 + \Delta\omega)C_{ft}R_B - 2Q\frac{\Delta\omega}{\omega_0} = const. \quad \text{(equation [19])}$$

Assuming $Q<<1$, [19] may further be simplified as $$\omega_0 C_{ft} R_B - 2Q\frac{\Delta\omega}{\omega_0} = const. \quad \text{(equation [20])}$$

Taking the differential $$\delta\Delta\omega \approx \frac{\omega_0^2 C_{ft}}{2Q}\delta R_B \quad \text{(equation [21])}$$

with respect to $R_B$ and $\Delta\omega$ relates any change in $R_B$ to a change in the oscillation frequency.

When plotting the real part of the admittance on the x axis ($1/R_{B,\alpha 1}$, $1/R_{B,\alpha 2}$) against the imaginary plot of the RLC branch on the y axis ($\omega_{\alpha 1}C_{ft}$, $\omega_{\alpha 2}C_{ft}$) for frequencies close to the resonance frequency, $\omega_0$, a plot of circles intersecting resonance points $\omega_{\alpha 1}$, $\omega_{\alpha 2}$ results. Each point on the circles intersecting $\omega_{\alpha 1}$, $\omega_{\alpha 2}$ corresponds to a frequency $\omega$ and when $\omega$ is increased the circles follow in a clockwise direction; thus, if the frequency is swept, the plot will follow the circle. The circles may be translated along the imaginary axis by an amount equal to the feedthrough admittance $j\omega C_{ft}$ when plotting the total admittance. In the oscillator loop, the phase of the admittance is fixed by the phase of the amplifier gain M, as illustrated by the straight line 510 crossing the origin in FIG. 5. If the resonant circuit 400 is placed in a magnetic field, the values of elements $R_B$, $C_B$, and $L_B$ will change value, and the circle will expand (e.g., circle intersecting $\omega_{\alpha 2}$), or contract (e.g., circle intersecting $\omega_{\alpha 1}$). The angle at which the line crosses the x-axis is equal to the phase shift of M. The crossing of the fixed phase line 510 with the circle $\omega_{\alpha}1$, $\omega_{\alpha}2$ sets the oscillation frequency. The oscillator may lock at a frequency corresponding to a point on the circle which is at a fixed phase. The fixed phase line 510 shows the resonance frequency (the points of intersection $\omega\alpha 1$, $\omega\alpha 2$ of the fixed phase lines and the circle plots illustrate the resonance frequencies). When the circle plot expands or contracts, the crossing points $\omega_\alpha 1$, $\omega_\alpha 2$, move in relation to each plotted circle, representing the frequency shift of the oscillation. The detuning factor δ causes a shift in oscillation frequency, because the detuning factor δ causes a change in the circle diameter 520, and hence a different crossing of the fixed phase line with the admittance circles intersecting $\omega_\alpha 1$, $\omega_\alpha 2$.

Thus, in summary, a change in the orientation of a magnetic field with respect to magnetometer 100 causes a change in the Lorentz force $F_{lor}$ acting on membrane 110, thereby causing a change of equivalent impedance $R_B$, causing a change in the oscillation frequency (equation [21]).

Table 1 illustrates the properties of an exemplary membrane such as those currently in use in some pressure sensor applications. These membrane parameters are merely exemplary, but these parametric values may be used to illustrate the magnitude of the shift in oscillation frequency. Different parameters may be used to implement the membrane, and the values will change in relation to each other by simple scaling rules—for example, if the membrane is twice as big, the resonance frequency will be twice as low, the mass will be twice as high, and the stiffness twice as low, etc. Although there may be some variability of metallic membrane size and manufacture, the exemplary membrane of Table 1 is of an exemplary size for low cost, simplicity of manufacture, and integration with CMOS.

The shift in oscillation frequency for the exemplary membrane of Table 1 may be derived by calculating the admittance circles as described above. For example, if admittance is calculated when the AC current runs parallel with the magnetic field (circle intersecting $\omega\alpha 1$) and is perpendicular to the earth's magnetic field (circle intersecting $\omega\alpha 2$), the change of diameter is calculated to be approximately 1%. The amplifier phase may be fixed to a value of for example, 60 degrees, which fixes the oscillation frequency and allows for the calculation of frequency shift as a result of the change in circle diameter 520. Thus, a 90 degree rotation of the earth's magnetic field would result in a 50 ppm shift in oscillation frequency, which is well within the resolution of most frequency measurement systems.

TABLE 1

| symbol | Value | unit | Description |
| --- | --- | --- | --- |
| B | 2.50E−05 | T | Magnitude of earth's magnetic field |
| V | 10 | V | Voltage bias applied to membrane |
| l | 3.50E−04 | m | Length of membrane |
| w | 3.50E−04 | m | Width of membrane |
| g | 1.00E−06 | m | Gap underneath membrane |
| f0 | 6.00E+05 | Hz | Resonance frequency |
| k | 1.23E+04 | N/m | Membrane stiffness |
| m | 8.62E−10 | kg | Membrane mass |
| Q | 1.00E+02 | | Q-factor |
| Rs | 1.00E−01 | W | Sheet resistance of membrane |

The crossing of the fixed phase line 510 with the circle marks the oscillation frequency, and shifts when the circle diameter changes as a result of a change in magnetic field orientation.

Figure 6:
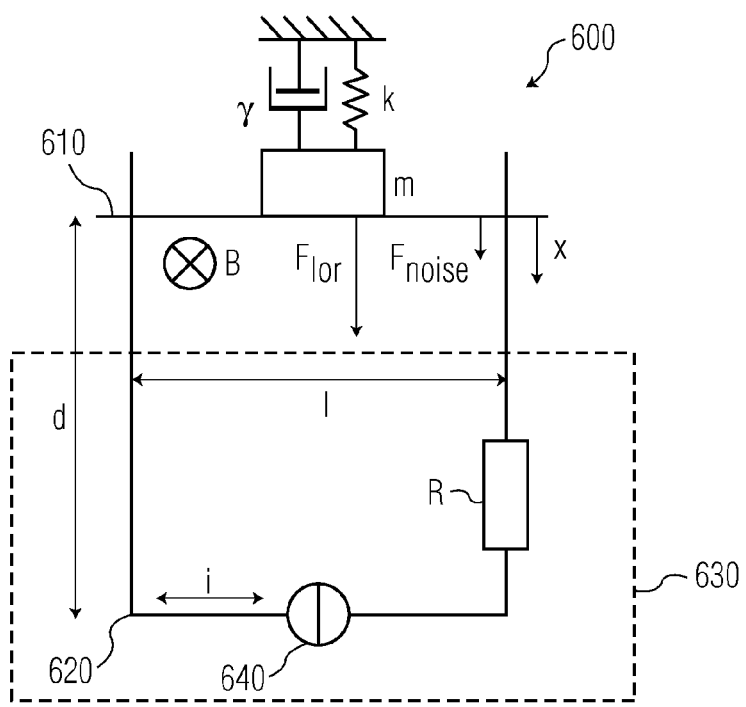
FIG. 6 illustrates a cross section of a winding embedded in a metallic membrane and a substrate.

In light of the forgoing, the measurement of a direction of a magnetic field may be understood with reference to the actuation, displacement, or movement of a membrane 110 as it responds to a Lorentz force $F_{lor}$ generated by the magnetic field, a bias voltage, and a current. FIG. 6 illustrates a cross section of one winding of a coil 620 as may be embedded in a metallic mechanical membrane 610 (open to the air), where the coil is also shown embedded in a substrate 630. Supply current i begins in the substrate 630 at current source 640, runs through the mass m of the wire embedded in the membrane 610 and encounters resistance R in the substrate 630 before continuing through the wire coil loop. As may be understood by one of skill in the art, the membrane 610 is a spring/mass system 600, so the membrane 610 has mass m, stiffness k, and damping coefficient γ. Assuming that there is a magnetic field B in the plane of the membrane 610 following the surface of the wafer, the Lorentz force $F_{lor}$ will draw membrane 610 out of plane downwards as shown. Additionally, the membrane will also be subjected to a Brownian (random) force $F_{noise}$, which as discussed above is the mechanical noise.

Note that in some embodiments, if the required measurement is the earth's magnetic field, the magnetic field generated by the coil itself may also be accounted for. The total magnetic field B effecting membrane 610 may be caused by both the earth's magnetic field $B_0$, and the magnetic field of the coil, $$\mu_0 \frac{Ni}{W} e^{j\omega t},$$

such that $$B = B_0 + \mu_0 \frac{Ni}{W} e^{j\omega t}. \quad \text{(equation [22])}$$

In order to measure the earth's magnetic field $B_0$ calculations may be made to eliminate the effects of the magnetic field caused by the coil which effect the total magnetic field B. The Lorentz force $F_{lor}$ expressed above with regards to FIG. 2A as $N*l*i_{in}*B$, may thus be expressed as $$F_{lor} = Nil\left(B_0 + \mu_0 \frac{Ni}{W}\right), \text{ or} \quad \text{(equation [23])}$$

$$F_{lor} = NlB_0 i + \mu_0 \frac{lN^2}{W} i^2. \quad \text{(equation [24])}$$

In the mass/spring system 600, subjected to external forces $F_{lor}$ and $F_{noise}$, the equation of motion x may be derived as (equation [25]) $NlB_0 i = -\omega^2 mx + j\omega\gamma x + kx$ (only considering terms varying with frequency ω given to the current i, which is a frequency that may be imposed on the system). Because as seen in [25] the equation of motion may be derived with regards to only the earth's magnetic force $B_o$ the magnetic field of the coils may thus be accounted for by measuring the displacement x of the membrane 610. Note that the frequency of the magnetic field self-generated by the coil will differ from the frequency of the magnetic field generated by the earth's magnetic field, and thus may become irrelevant to the measurement of $B_0$ as shown.

As discussed above, the magnitude of the Lorentz force $F_{lor}$ is dependent on the angle between the magnetic field and the membrane sheet or wires embedded in the membrane, such that $F_{lor}$ will differ depending upon the angle of the magnetic field relative to the angle α of the membrane, because a current running in the x-direction will cause a different detuning of the oscillation frequency than a current running in the y-direction. The displacement of the wire or membrane 610 will be largest at its resonance frequency. Peak displacement $x_{pk}$ of membrane 610 at resonance frequency $\omega_0$ may be expressed as $$x_{pk} = Q \frac{NlB_0 i}{k} \quad \text{(equation [26])}$$

(Q times the force, divided by the spring constant k, or: Q times the number of wires N, the length of the membrane (and thus of each coil of wire) l, the earth's magnetic field $B_0$, and the current through the wires i; divided by the spring constant of the membrane k). Finally, note that the additional displacement provided by $F_{noise}$ ($F_{noise} = \sqrt{4k_b T\gamma \Delta f}$) will provide the signal-to-noise ratio as discussed above. Thus by calculating the Lorentz force $F_{lor}$ and accounting for $F_{noise}$ the angle α of the earth's magnetic field $B_0$ can be determined.

The minimum Lorentz force $F_{lor}$ that may be detected by exemplary membranes 210 610 as shown with reference to FIGS. 2A and 6, is determined by the mechanical detection limit of mass/spring system 600, which is where the amount of random noise overwhelms the Lorentz force. In other words, when the random noise is equal to the Lorentz force, the sensor is at the detection limit. As a specific example, the mechanical detection limit as shown in an exemplary membrane 210 610, where the number of windings N may be 90, the depth of the loop d may be 5 μm, the length l of the membrane 210 610 may be 220 μm, the current i may be 1 mA root mean square (rms), the resistance R may be 1 kOhm, and the bandwidth Δf may be 4 Hz, the Lorentz force $F_{lor}$ may be $8.4*10^{-10}$N, noise force $F_{noise}$ may be $1.0*10^{-12}$N, displacement x $9.9*10^{-12}$ m (~10 picometers), and the mechanical detection limit 25 nT/√Hz (25 nano-Tesla per square root Hz). By comparison, Hall compass sensors have a noise floor of 100 nT/√Hz, and so are less sensitive than a compass using a metallic membrane as described herein.

Figure 7:
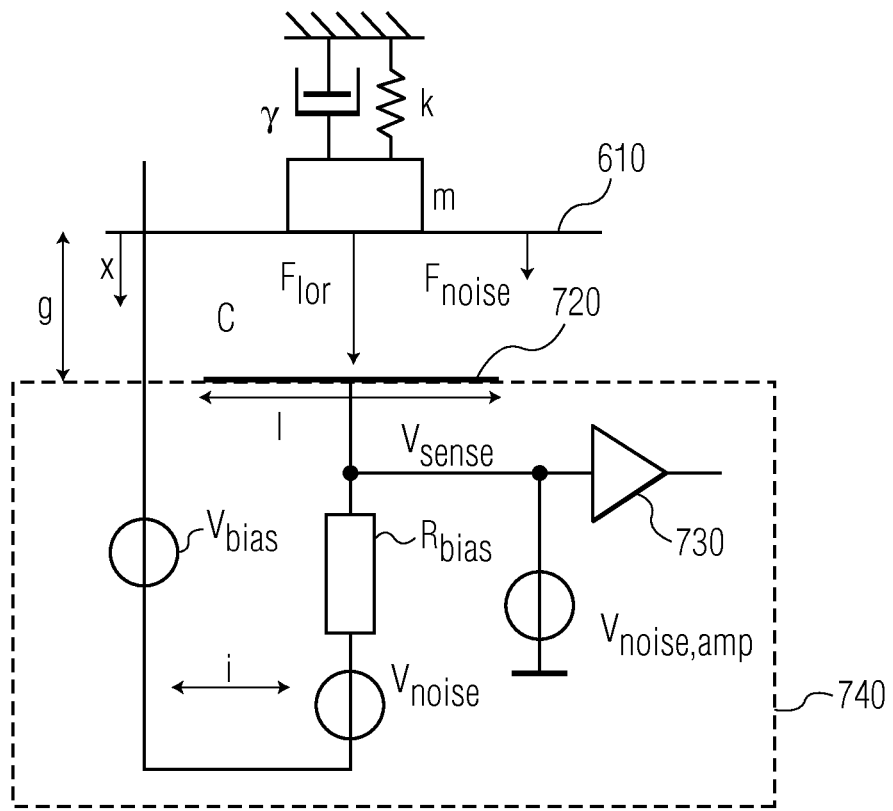
FIG. 7 illustrates a cross section of a membrane and circuit for outputting a sensor reading to calculate a magnetic field based upon the displacement of a membrane.

In order to measure the displacement of membrane 610, and thus the magnetic force $B_0$ as described above, the displacement x may be measured electrically. FIG. 7 illustrates a cross section of membrane 610 with reference to an electrode 720 atop substrate 740 and below membrane 610. Electrode 720 may be a plate held at potential $V_{bias}$, at a gap distance g from membrane 610, causing the plate 720 and membrane 610 to be capacitively coupled (because of their proximity to one another and the voltage $V_{bias}$) by a capacitance C, which generates a displacement current which can be measured.

Figure 8:
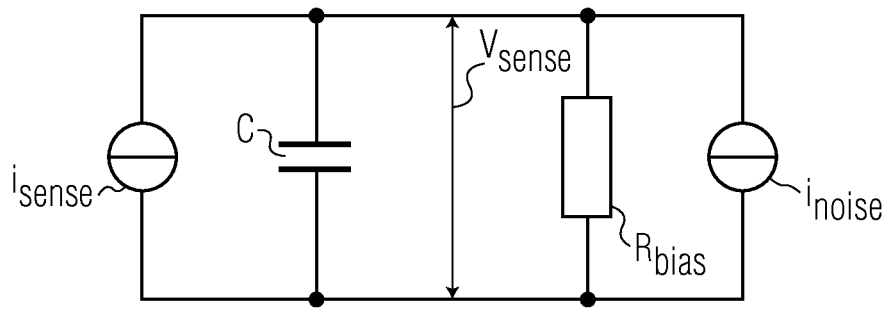
FIG. 8 illustrates an exemplary circuit electrically equivalent to the membrane and circuit of FIG. 7.

FIG. 8 illustrates an exemplary circuit electrically equivalent to the system of FIG. 7. As can be seen in FIGS. 7 and 8, two displacement current sources, $i_{sense}$ (the output current caused by membrane displacement) and $i_{noise}$ may be caused by the Lorentz force $F_{lor}$ and random noise $F_{noise}$ displacing membrane 610 a distance x; these two currents, $i_{sense}$ and $i_{noise}$ may be pushed through bias resistor $R_{bias}$ and the capacitance C made by the plate if membrane 610 and plate of electrode 720. The current generated by the displacement of the Lorentz force $Fl_{or}$, and thus the capacitance C, may be expressed as $$i_{sense} = j\omega_0 x V_{bias} \frac{\partial C}{\partial x}.$$

The noise current $i_{noise}$ is dependent on the bandwidth of the current, the stiffness of the membrane, and the amount of bias resistance $R_{bias}$, and may be expressed as $$i_{noise,rms} = \sqrt{\frac{4k_b T}{R_{bias}} \Delta f}.$$

In order to minimize the effect of noise, it is desirable to maximize the resistance $R_{bias}$, which may be expressed as $$R_{bias} \gg \frac{1}{\omega_0 C}.$$

As the current is pushed through the impedances of $R_{bias}$ and C, they generate an output signal $v_{sense}$ (the output voltage caused by the displacement of the membrane), which may be measured to determine $B_0$ as explained herein. Output reading $v_{sense}$ may be calculated for values x (displacement) and C (capacitance) because the membrane size $l^2$, the size of gap g, and the capacitance C for a Lorentz force $F_{lor}$ will be known as discussed herein. $R_{bias}$ may be very large, so that $v_{sense}$, which is equal to the bias voltage times the displacement derivative of the capacitance times the displacement normalized to the capacitance, which may be expressed as $$v_{sense} = \frac{1}{j\omega_0 C} i_{sense} = V_{bias} \frac{\partial C}{\partial x} \frac{x}{C}.$$

Note that for purposes of detection, $v_{sense}$ may be amplified through an amplifier 730, which will also introduce electrical noise $v_{noise\ amp}$, in addition to electrical noise caused by the circuit, $v_{noise}$. However, an exemplary calculation will show that the effect of the electrical noise will be negligible on the detection limit of the sensor compared to the mechanical noise. The amplifier noise may be expected to be greater than random system noise. In an exemplary membrane 610 with length l of 220 µm, a gap g of 500 nm, a bias voltage $V_{bias}$ of 10 v, a bandwidth $\Delta f$ of 4 Hz, and amplifier noise for an exemplary amplifier of $v_{noise,\ amp}$ of ~20 nV rms, the capacitance C may be 860 fF, the resistance $R_{bias} \gg 200$ kOhm, and peak sensor voltage $v_{sense,\ peak}$=200V; the electrical detection limit will be 2 nT/√Hz (2 nano-Tesla per square root Hz). As discussed above, the mechanical detection limit is 25 nT/√Hz, and the combination will be $\sqrt{(25nT/\sqrt{Hz})^2 + (2nT/\sqrt{Hz})^2}$ or ~25.08 nT/√Hz—barely different than the mechanical noise alone.

According to the foregoing, various exemplary embodiments provide for a magnetometer manufactured in an inexpensive, multiple use form factor. In particular, by implementing a metallic membrane implemented in a CMOS-based magnetometer that senses phase shifts of an oscillator that includes the membrane.

It should be apparent from the foregoing description that various exemplary embodiments of the invention may be implemented in hardware and/or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications may be affected while remaining within the spirit and scope of the invention. Accordingly, the foregoing disclosure, description, and figures are for illustrative purposes only and do not in any way limit the invention, which is defined only by the claims.

What is claimed is:

1. A magnetometer device to measure oscillation frequency, the device comprising:
    a feedback loop comprising an amplifier and a voltage bias connected to a first input of a metallic membrane;
    a membrane ground connected to a membrane output;
    a fixed plate comprising a first fixed plate output connected to a second input of the amplifier,
    wherein the fixed plate is physically separated from the metallic membrane but connected to the metallic membrane by a Lorentz force, and where the physical separation differs due to an angle of a magnetic field relative to a direction of a current;
    a second fixed plate output sensitive to the Lorentz force; and
    a circuit connected to the second fixed plate output to calculate an angle of the magnetic force based upon the Lorentz force,
    wherein the feedback loop is configured to:
        create a capacitive displacement current;
        feed the capacitive displacement current to the amplifier;
        amplify, by the amplifier, the capacitive displacement current; and
        feed the amplified current as voltage to the metallic membrane.

2. The magnetometer device of claim 1, wherein the metallic membrane further comprises a continuous sheet of metal.

3. The magnetometer device of claim 1, wherein the metallic membrane further comprises a continuous metallic winding running in parallel lines from the membrane input to the membrane output.

4. The magnetometer device of claim 3, wherein the metallic membrane further comprises a dielectric sheet in which the metallic winding is embedded.

5. The magnetometer device of claim 1, wherein the metallic membrane has an equivalent electrical inductance proportional to the mechanical mass of the metallic membrane, an equivalent electrical capacitance proportional to the mechanical stiffness of the metallic membrane, and an equivalent electrical resistance proportional to the mechanical damping of the metallic membrane.

6. The magnetometer device of claim 1, wherein the amplifier comprises a current controlled voltage source.

7. The magnetometer device of claim 6, wherein the current controlled voltage source comprises a gain.

8. The magnetometer device of claim 1, wherein the fixed plate has the same proportions as the metallic membrane.

9. The magnetometer device of claim 1, wherein the metallic membrane is freestanding.

10. The magnetometer device of claim 1, wherein the fixed plate is fixed to a substrate.

11. The magnetometer device of claim 1, wherein the fixed plate is fixed to a wafer.

12. A magnetometer device to measure the orientation of a device, the magnetometer device comprising:
    an oscillator comprising a metallic membrane and a feedback loop;
    the feedback loop comprising an amplifier, the feedback loop configured to
        drive an alternating electrical current through the metallic membrane;
        drive the metallic membrane into an oscillation;
        create a capacitive displacement current;
        feed the capacitive displacement current to the amplifier;
        amplify, by the amplifier, the capacitive displacement current; and
        feed the amplified current as voltage to the metallic membrane;
    a processor configured to:
        measure a shift of oscillation frequency caused by the feedback loop and metallic membrane; and
        calculate an angle of an external magnetic field relative to a direction of the current, based upon the shift of oscillation frequency and the current direction.

13. The magnetometer device of claim 12, wherein the oscillation is close to a mechanical resonance frequency of the metallic membrane.

14. The magnetometer device of claim 12, further comprising a fixed ground plate, the device further configured to generate a bias voltage between the metallic membrane and the fixed ground plate.

15. The magnetometer device of claim 14, wherein the fixed ground plate is situated a small distance from the metallic membrane.

16. The magnetometer device of claim 14, wherein the fixed ground plate has the same proportions as the metallic membrane.

17. The magnetometer device of claim 12, wherein, in calculating the angle of an external magnetic force, the processor is further configured to cancel oscillation frequency detuning effects.

18. The magnetometer device of claim 17, the processor further configured to, when cancelling oscillation frequency detuning effects, subtract the oscillation frequency for one or more current directions.

19. The magnetometer device of claim 12, the processor further configured to filter interference from the oscillation of the metallic membrane.

20. The magnetometer device of claim 19, the processor further configured to measure the frequency of the oscillator over a sufficient time period.

21. A magnetometer device to measure the orientation of a device, the magnetometer device comprising:
    an oscillator comprising a metallic membrane and a feedback loop;
    the feedback loop configured to drive an alternating electrical current through the metallic membrane, and to drive the metallic membrane into an oscillation; and
    a processor configured to:
        measure a shift of oscillation frequency caused by the feedback loop and metallic membrane;
        calculate an angle of an external magnetic field relative to a direction of the current, based upon the shift of oscillation frequency and the current direction; and
        cancel oscillation frequency detuning effects by subtracting the oscillation frequency for one or more current directions when calculating the angle of the external magnetic field.

* * * * *